US008502565B2

(12) United States Patent
Arnborg

(10) Patent No.: US 8,502,565 B2
(45) Date of Patent: Aug. 6, 2013

(54) LOW PHASE NOISE BUFFER FOR CRYSTAL OSCILLATOR

(75) Inventor: Torkel Arnborg, Stockholm (SE)

(73) Assignee: ST-Ericsson SA, Plan-les-Ouates (CH)

( * ) Notice: Subject to any disclaimer, the term of this patent is extended or adjusted under 35 U.S.C. 154(b) by 171 days.

(21) Appl. No.: 12/843,145

(22) Filed: Jul. 26, 2010

(65) Prior Publication Data

US 2012/0019321 A1    Jan. 26, 2012

(51) Int. Cl.
H03K 5/22    (2006.01)

(52) U.S. Cl.
USPC ............... 327/65; 327/66; 327/178; 330/253

(58) Field of Classification Search
USPC ............................ 327/65, 66, 178; 330/253
See application file for complete search history.

(56) References Cited

U.S. PATENT DOCUMENTS

| | | | | |
|---|---|---|---|---|
| 4,973,864 | A * | 11/1990 | Nogami ........................... | 327/55 |
| 5,115,206 | A | 5/1992 | Mack et al. | |
| 5,703,519 | A * | 12/1997 | Crook et al. .................. | 327/387 |
| 6,577,170 | B1 * | 6/2003 | Prodanov ...................... | 327/103 |
| 6,771,126 | B2 | 8/2004 | Blankenship et al. | |
| 7,142,005 | B1 | 11/2006 | Gaboury | |
| 7,250,792 | B2 * | 7/2007 | Swartz et al. ................... | 327/65 |
| 7,453,317 | B2 * | 11/2008 | Koh et al. ...................... | 330/253 |
| 2007/0152763 | A1 | 7/2007 | Mansuri | |

FOREIGN PATENT DOCUMENTS

| | | |
|---|---|---|
| EP | 1811669 A1 | 7/2007 |
| WO | 9728601 A1 | 8/1997 |
| WO | 2008121521 A1 | 10/2008 |

OTHER PUBLICATIONS

Amourah, M., et al., "All Digital Transistors High Gain Operational Amplifier Using Positive Feedback Technique", IEEE International Symposium on Circuits and Systems, May 26, 2002, pp. 1-701-1-704, vol. 1, IEEE, US.
Nair, A., et al., "Laboratory 4—Differential Amplifiers—Resistor Load and Cross Couple Diode Load", Jul. 6, 2007, pp. 1-2, V L S I L a b@ I I T D, Indian Institute of Technology, Delhi, India.
Razavi, B., et al., "Design Techniques for High-Speed, High-Resolution Comparators", IEEE Journal of Solid-State Circuits, Dec. 1, 1992, pp. 1916-1926, vol. 27, Issue 12, IEEE Solid-State Circuits Society.
Allstot, D., "A Precision Variable-Supply CMOS Comparator", IEEE Journal of Solid-State Circuits, Dec. 1, 1982, pp. 1080-1087, vol. 17, Issue: 6, IEEE Solid-State Circuits Society.
Gustafsson, S., et al., "Low-noise operational amplifiers using bipolar input transistors in a standard metal gate CMOS process", Electronics Letters, Jun. 21, 1984, pp. 563-564, vol. 20, Issue: 13, Institution of Engineering and Technology, IEEE.

(Continued)

Primary Examiner — Kenneth B. Wells
(74) Attorney, Agent, or Firm — Coats & Bennett, P.L.L.C.

(57) ABSTRACT

A buffer for converting sinusoidal waves to square waves with reduced phase noise is described herein. The buffer shunts current from the outputs of a differential amplifier during sinusoidal state transition periods at the differential amplifier inputs to increase the finite slope of square wave transition periods of the output square wave. More particularly, a sinusoidal wave having alternating peaks and valleys connected by sinusoidal state transition periods is applied to differential inputs of a differential amplifier to generate a square wave at the differential outputs, where the output square wave comprises alternating high and low states connected by square wave state transition periods having a finite slope. The output square wave is shaped to increase the finite slope of the square wave transition periods by providing additional paths between the differential outputs and ground that shunt current from the differential amplifier during the sinusoidal state transition periods.

19 Claims, 11 Drawing Sheets

OTHER PUBLICATIONS

Lee, T., et al., "Oscillator Phase Noise: A Tutorial", IEEE Journal of Solid-State Circuits, Mar. 1, 2000, pp. 326-336, vol. 35, Issue: 3, IEEE Solid-State Circuits Society.

Adler, R., "A Study of Locking Phenomena in Oscillators", Proceedings of the I.R.E. and Waves and Electronics, Jun. 1, 1946, pp. 351-357, vol. 34, Issue: 6, IEEE.

* cited by examiner

LOW PHASE NOISE BUFFER FOR CRYSTAL OSCILLATOR

BACKGROUND

The present invention generally relates to generating square waves from sinusoidal waves, and more particularly to reducing phase noise present in a square wave generated from a sinusoidal wave.

Crystal oscillators are configured to generate an analog sinusoidal wave at a desired frequency. Due to their frequency stability, crystal oscillators are often used to provide stable clocks for digital circuits. To that end, a conventional system typically uses a buffer to convert the analog sinusoidal wave generated by the crystal oscillator into a square wave suitable for the digital circuit. Such buffers may also be used to reduce noise present in the square wave. For example, a differential amplifier may be used as a buffer between the crystal oscillator and the digital circuit, where the differential inputs reject common mode noise to reduce noise in the square wave output by the differential outputs. However, conventional buffers generally do not address or reduce phase noise present in the generated square wave. Because wireless standards such as GPS, Bluetooth, WLAN, etc., have strict phase noise requirements, there is a need to reduce the phase noise present in square waves generated from sinusoidal waves, such as those output by a crystal oscillator.

SUMMARY

The present invention reduces phase noise present in square waves generated from sinusoidal waves, where the square waves have alternating high and low states connected by state transition periods and the sinusoidal waves have alternating peaks and valleys connected by state transition periods. More particularly, the present invention shunts current from the outputs of a differential amplifier during sinusoidal state transition periods at the differential amplifier inputs to increase the finite slope of the square wave transition periods of the output square wave.

According to the present invention, an input sinusoidal wave is applied to the differential inputs of a differential amplifier to generate an output square wave at the differential outputs. The output square wave is shaped to increase the finite slope of the square wave transition periods by connecting feed forward transistors between the differential outputs and ground that conduct more than the primary current drain paths of the differential amplifier during the sinusoidal state transition periods.

According to one exemplary embodiment, a buffer comprises a differential amplifier and a pair of feed forward transistors. The differential amplifier includes differential inputs, a pair of serially connected transistors, and differential outputs interposed between the pair of serially connected transistors. A first feed forward transistor is connected to the differential amplifier between the positive output and ground, while a second feed forward transistor is connected to the differential amplifier between the negative output and ground. The differential amplifier generates the output square wave from an input sinusoidal wave applied to the differential inputs. During the peaks and valleys of the input sinusoidal wave, load transistors in the differential amplifier are configured to provide the primary current drain paths between the differential outputs and ground. During sinusoidal state transition periods, however, the feed forward transistors are configured to shape the output square wave by increasing the finite slope of the square wave transition periods.

DETAILED DESCRIPTION

Figure 1:
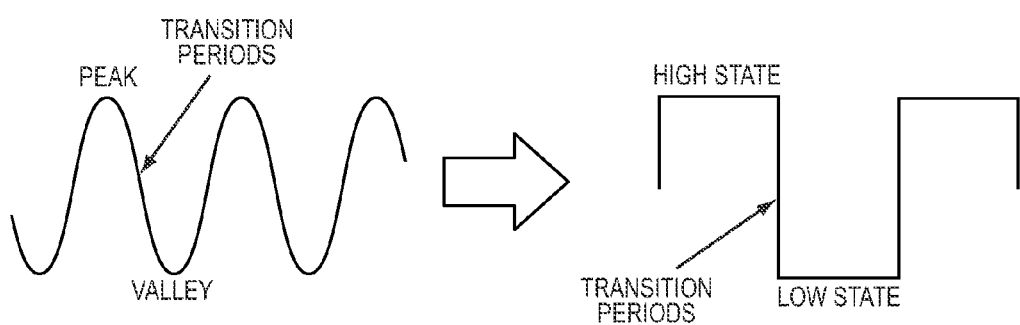
FIG. 1 shows an ideal sinusoidal wave and square wave.

Crystal oscillators provide stable sinusoidal output signals that may be used as reference signals, e.g., clocks, for digital circuits. Typically, a sinusoidal wave output by an oscillator is converted to a square wave suitable for digital applications. FIG. 1 shows an exemplary sinusoidal wave and an ideal square wave. The sinusoidal wave consists of alternating peaks and valleys connected by sinusoidal state transition periods. The square wave includes alternating high and low states connected by square wave state transition periods. While the state transition periods of an ideal square wave have infinite slope, in practice the state transition periods of a square wave generated from a sinusoidal wave have finite slope, which causes such square waves to be sensitive to phase noise.

Figure 2:
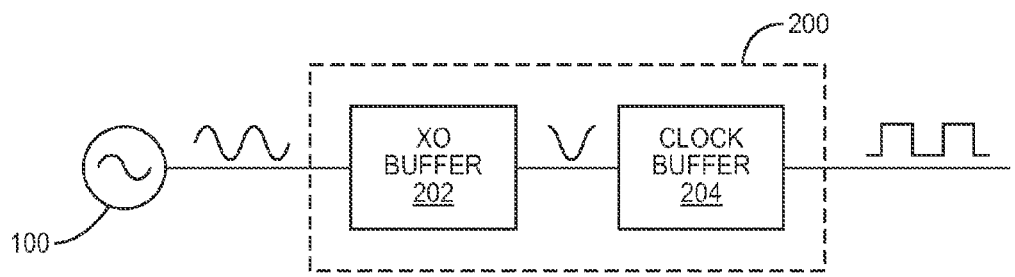
FIG. 2 shows one exemplary clock generator for converting a sinusoidal wave to a square wave.

FIG. 2 shows an exemplary clock generator 200 for generating a square wave from a sinusoidal wave output by a crystal oscillator 100. Crystal oscillator 100 generates the sinusoidal wave at a predetermined frequency. Clock generator 200 converts the sinusoidal wave to a square wave suitable for digital circuits, where the square wave has the same frequency as the original sinusoidal wave, and may or may not have the same amplitude.

Clock generator 200 comprises a crystal oscillator buffer 202 and a clock buffer 204. Crystal oscillator buffer 202 converts the sinusoidal wave to a distorted square wave having a square wave transition period with a finite slope, and clock buffer 204 generates the desired square wave from the distorted square wave. Because the state transition periods between the high and low states of the distorted square wave have finite slope, the distorted square wave is sensitive to phase noise.

Figure 3:
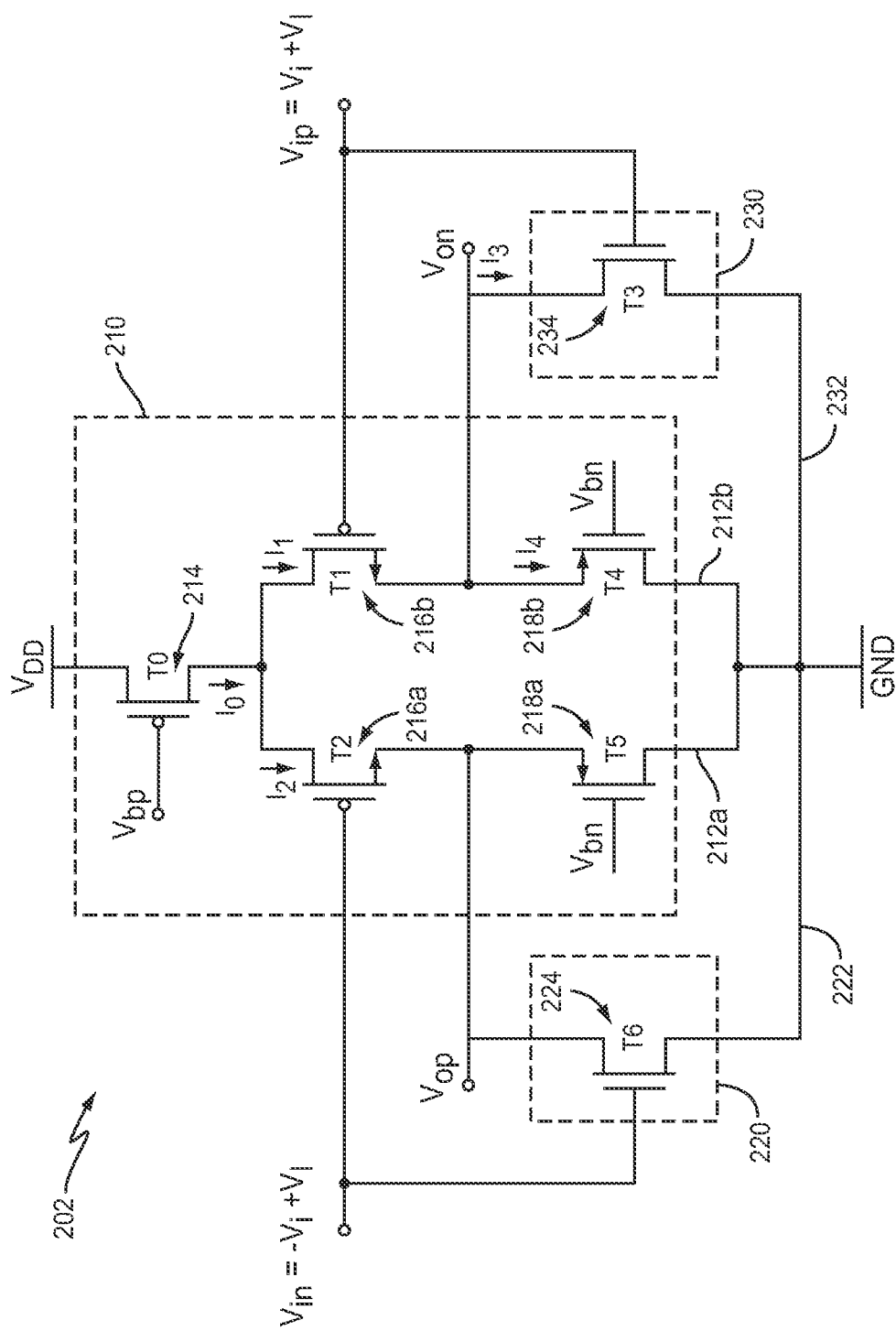
FIG. 3 shows a circuit diagram for a buffer according to one exemplary embodiment of the present invention.

The crystal oscillator buffer 202 of the present invention reduces the phase noise of the output square wave by increasing the finite slope of the square wave transition periods. FIG. 3 shows a simplified circuit diagram for one exemplary crystal oscillator buffer 202 comprising a differential amplifier 210 and wave shaping transistors 220, 230 coupled to the differential amplifier between the outputs of the differential amplifier 210 and ground. Differential amplifier 210 is configured to generate a square wave comprising alternating high and low states connected by square wave transition periods having a finite slope. During the sinusoidal transition periods of the input sinusoidal wave, the wave shaping transistors 220, 230 shunt current from the differential amplifier 210 to ground, which increases the finite slope of the square wave transition periods. For the embodiment of FIG. 3, the wave shaping transistors 220, 230 comprise feed forward transistors 224, 234, each having a source connected to a differential output, a drain connected to ground, and a gate connected to a differential input, so that the input sinusoidal wave directly controls the conductance of the feed forward transistors 224, 234. In FIG. 3, $V_{DD}$ represents a positive supply voltage, GND represents ground (which may also be represented as a negative supply voltage $V_{SS}$), $V_{ip}$ represents a differential positive input derived from the crystal oscillator output sinusoidal wave, $V_{in}$ represents a differential negative input derived from the crystal oscillator output sinusoidal wave, $V_{op}$ represents the positive differential output, $V_{on}$ represents the negative differential output, $V_i$ represents a differential input derived from the differential positive and negative inputs, $V_I$ represents common mode input derived from the differential positive and negative inputs, $V_{bp}$ represents a constant positive bias voltage, and $V_{bn}$ represents a constant negative bias voltage.

The differential amplifier 210 comprises a current generator transistor 214, a pair of serially connected transistors, where each serially connected pair includes an inverting transistor 216a, 216b, and a load transistor 218a, 218b. The differential outputs are interposed between the serially connected pairs of transistors 216, 218, as shown in FIG. 3. Load transistors 218a, 218b are coupled between the differential outputs and ground and operate as active loads having a constant gate voltage. The load transistors 218a, 218b and feed forward transistors 224, 234 control the shape of the output square wave and conduct current whenever the buffer 202 is active. The extent to which transistors 218, 224, 234 conduct current at any given time, however, depends on the voltage applied to the differential inputs. For example, as the input sinusoidal wave moves through peaks and valleys, the load shaping transistors 218a, 218b conduct more current while the feed forward transistors 224, 234 conduct less current. Thus, during the peaks and valleys, load transistors 218a, 218b provide the primary current drain paths for the buffer 202. As the input sinusoidal wave moves through the state transition periods between the peaks and valleys, however, the feed forward transistors 224, 234 conduct more current while the load transistors 218a, 218b conduct less current. By appropriately alternating the conductance of the load and feed forward transistors relative to the input sinusoidal wave, the buffer 202 of the present invention reduces the phase noise by increasing the finite slope of the square wave transition periods without adversely impacting the high and low states of the output square wave.

Figure 4:
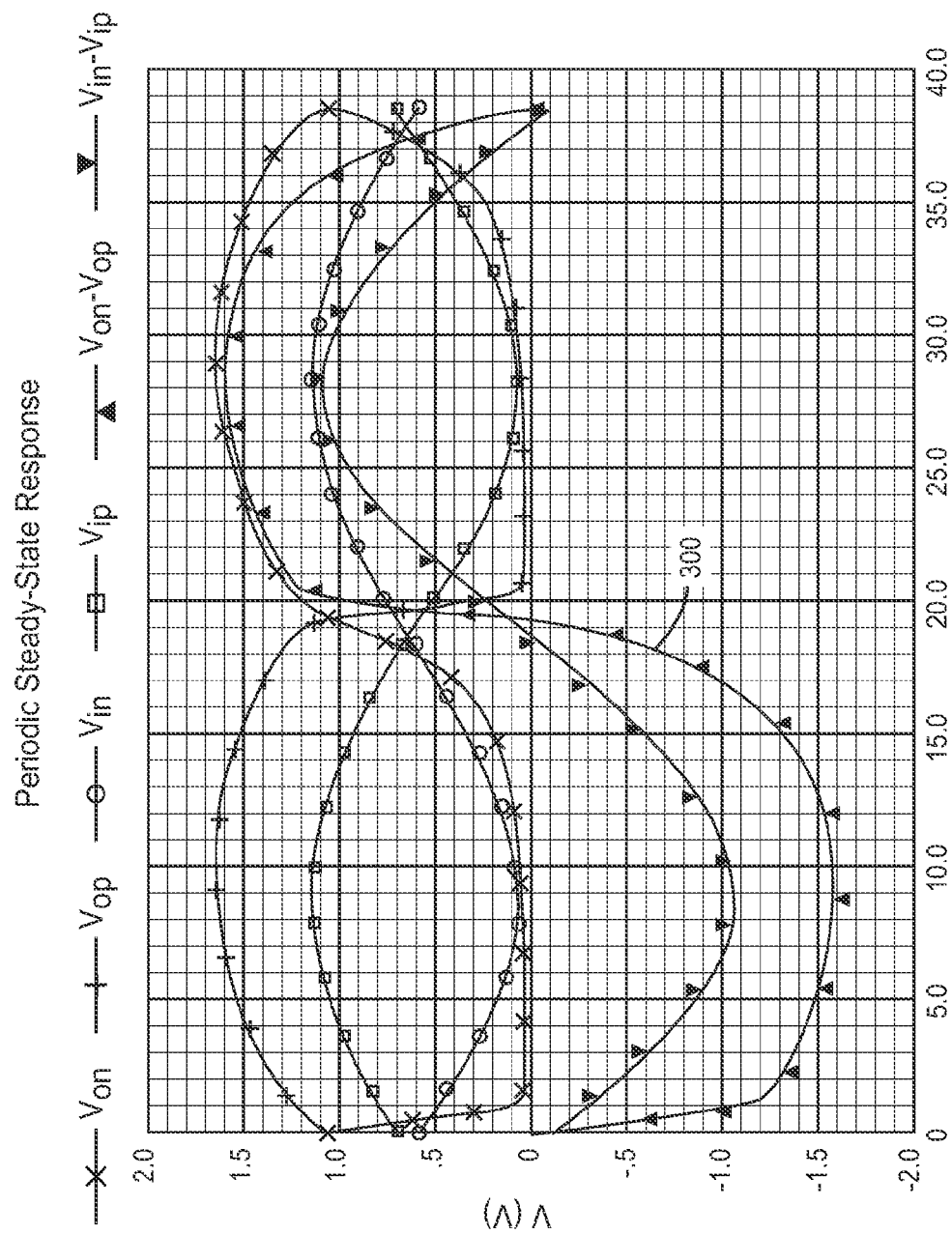
FIG. 4 shows the periodic steady state responses for a conventional buffer.
Figure 5:
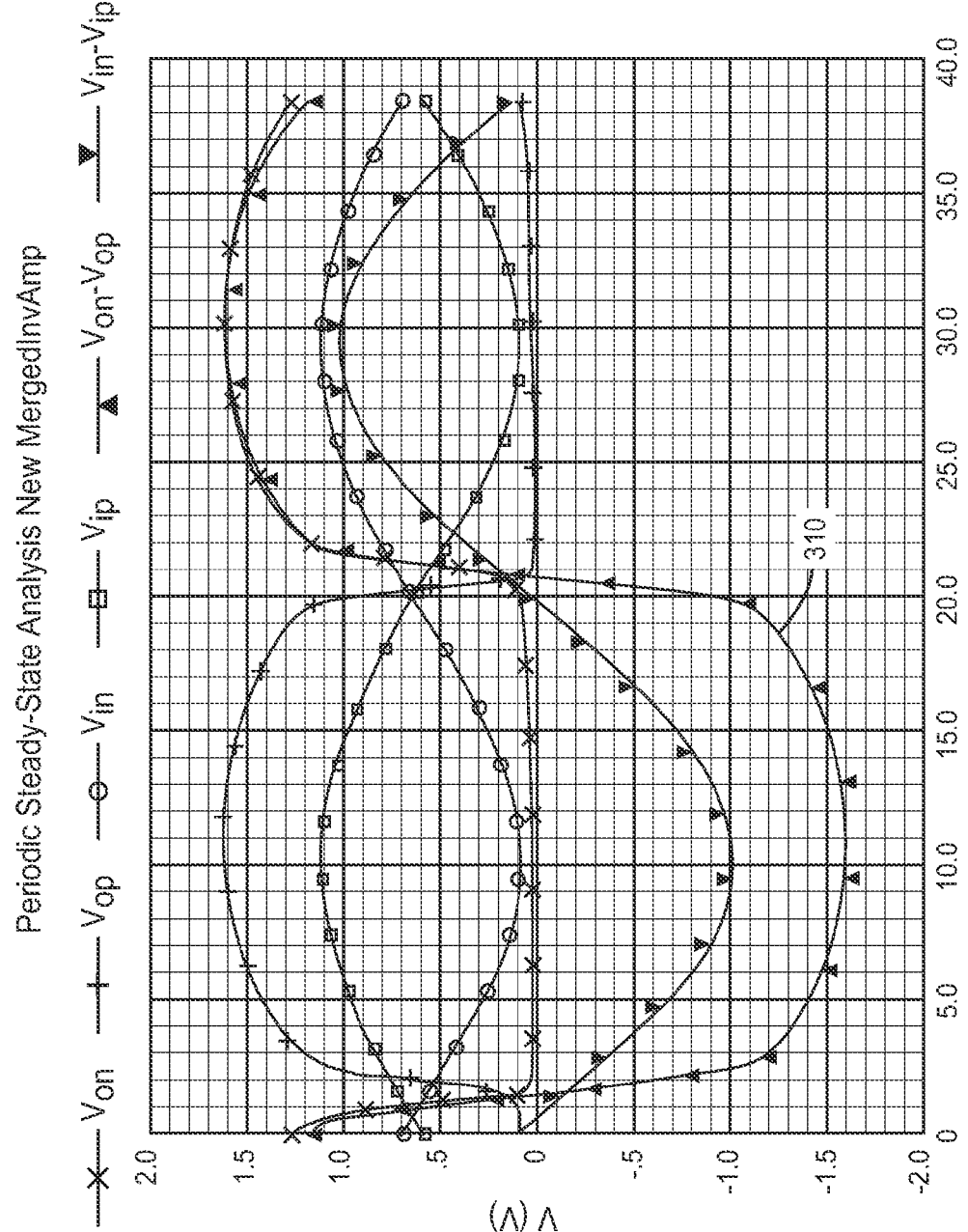
FIG. 5 shows the periodic steady state response for the buffer of FIG. 3.
Figure 6A:
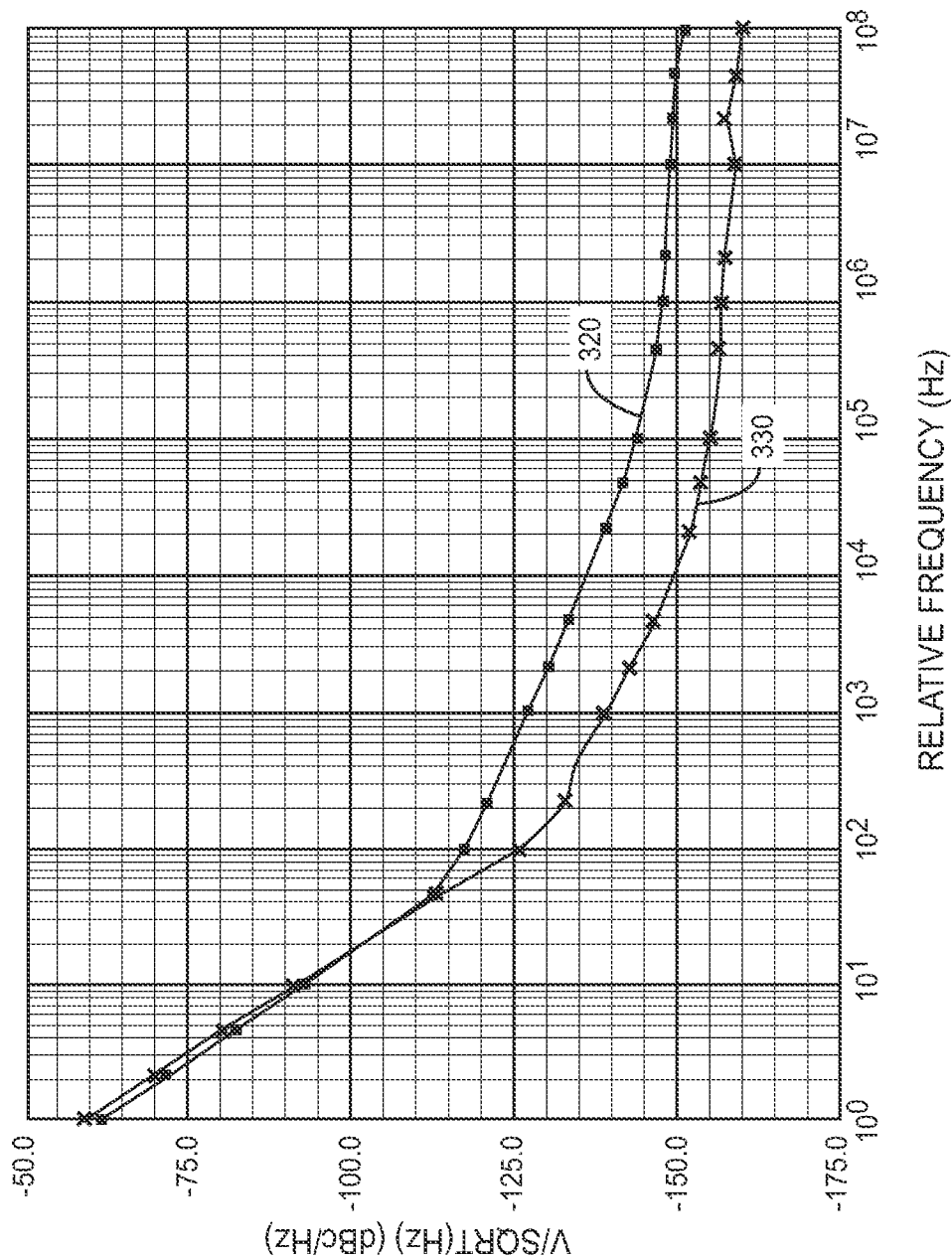
FIGS. 6A-6B show the phase noise and power supply rejection ratio performance of the buffer of FIG. 3.
Figure 6B:
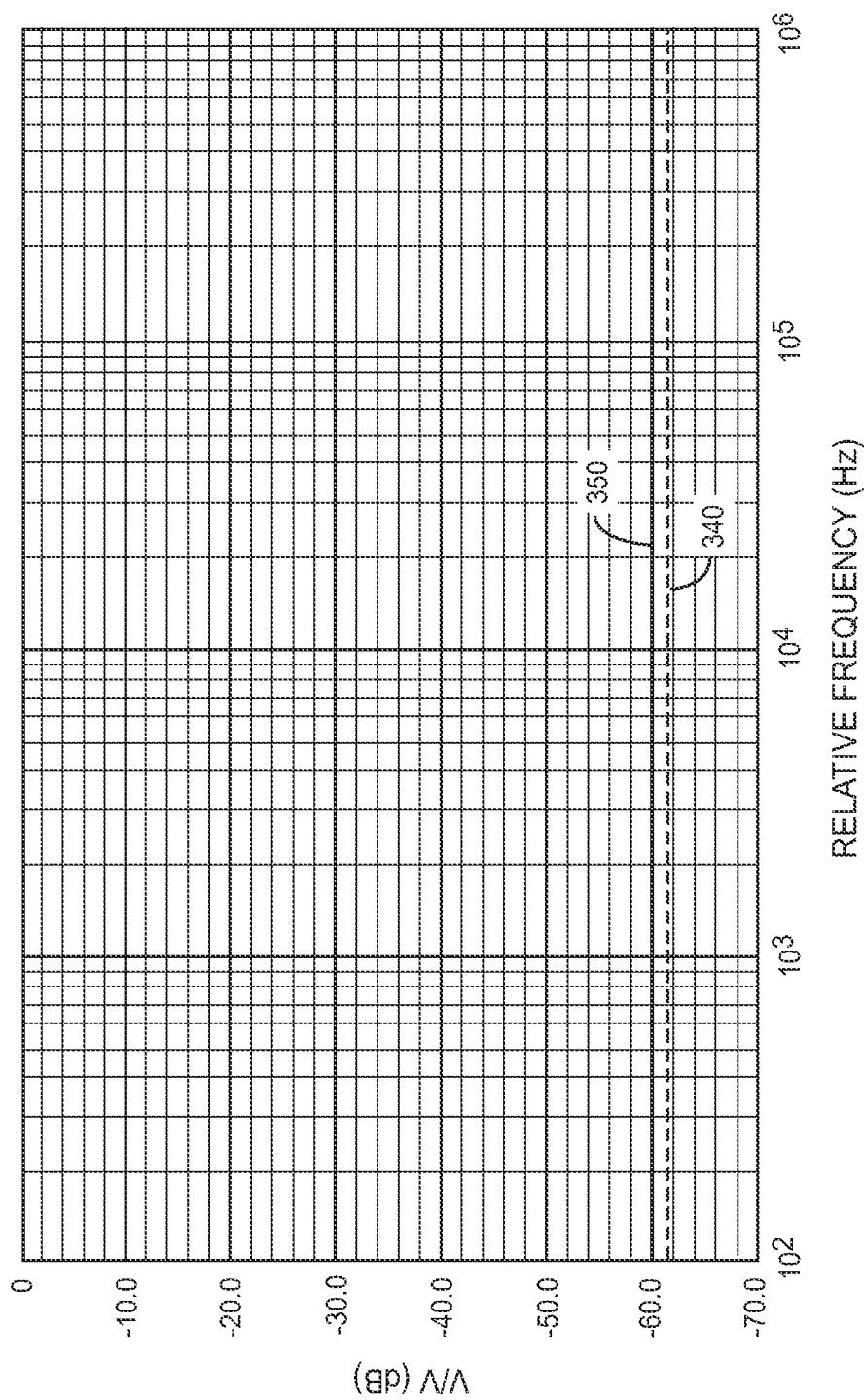

FIGS. 4-6 demonstrate the performance improvements provided by the buffer 202 of the present invention. FIG. 4 shows the simulated periodic steady state performance of a differential amplifier, while FIG. 5 shows the simulated periodic steady state performance of the crystal oscillator buffer 202 of FIG. 3. The output square wave 300 of FIG. 4 is appreciably less square than the output square wave 310 of FIG. 5. Thus, FIG. 5 demonstrates how the wave shaping transistors 220, 230 increase the finite slope of the output square wave. FIG. 6A compares the phase noise performance 320 of a differential amplifier to the phase noise performance 330 of buffer 202 of FIG. 3. While the phase noise performance is similar at lower frequencies, buffer 202 improves the phase noise performance for intermediate and high frequencies by 10 to 15 dB. FIG. 6B compares the Power Supply Rejection Ratio (PSRR) 340 for the differential amplifier to the PSRR 350 for the buffer 202. PSRR may be used to quantify the sensitivity of a circuit to spurious supply signals. FIG. 6B shows that the PSRR is not significantly or adversely affected by the wave shaping transistors 220, 230. The PSRRs shown in FIG. 6B results from standard PSRR simulations, where it is assumed the supply line, not ground, causes the main source of noise. Other PSRR simulations, such as the Monte Carlo simulation, provide similar results.

As generally described above, the buffer 202 alternates the conductance of the wave shaping transistors 220, 230 and the load transistors 218a, 218b relative to the input sinusoidal wave to generate an output square wave with reduced phase noise. To properly alternate the conductance, the load transistors 218a, 218b and the wave shaping transistors 220, 230 transistors should be equally conductive when the differential sinusoidal input voltage is zero ($V_i=0$). Thus, the conductance transition from the load transistors 218a, 218b to the wave shaping transistors 220, 230 (or vice versa) should occur when the differential input voltage is zero ($V_i=0$). The following mathematically describes how to determine the common mode input $V_I$ to provide the desired conductance transition.

The current output by current generator transistor 214 may be represented by:

$$I_0 = K_0(V_{DD} - V_{bp} - V_T)^2 \quad (1)$$

where $V_T$ represents a transistor threshold voltage. The current $I_1$ going into the source of inverting transistor 216b and the current $I_2$ going into the source of inverting transistor 216a may be represented by:

$$I_1 = K_1(V_S - V_i - V_I - V_T)^2 \text{ and} \quad (2)$$

$$I_2 = K_2(V_S + V_i - V_I - V_T)^2, \quad (3)$$

where $V_S$ represents the source potential for current generator transistor 214 and $K_1 = K_2$. $K_i$ represents the gain factor for MOS transistor i, which is given by:

$$K_i = \frac{W_i}{L_i} C_{ox}. \quad (4)$$

where $W_i$ represents the width of transistor i, $L_i$ represents the length of transistor i, and $C_{ox}$ represents the gate oxide capacitance per unit area. Because $I_0 = I_1 + I_2$, Equation (5) results from combining Equations (1) to (3).

$$I_0 = K_0(V_{DD} - V_{bp} - V_T)^2 = 2K_1(V_i^2 + (V_S - V_I - V_T)^2) \quad (5)$$

The currents $I_3$ and $I_4$ going into the sources of wave shaping transistor 230 and load transistor 218b, respectively, may be given by:

$$I_3 = K_3(V_i + V_I - V_T)^2, \text{ and} \quad (6)$$

$$I_4 = K_4(V_{bn} - V_T)^2. \quad (7)$$

Recognizing that when $$V_i = 0, I_3 + I_4 = \frac{1}{2}I_0:$$

$$K_3(V_I+V_I-V_T)^2+K_4(V_{bn}-V_T)^2=\tfrac{1}{2}K_0(V_{DD}-V_{bp}-V_T)^2. \quad (8)$$

When $V_i=0$, Equation (8) may be solved for $V_I$, producing:

$$V_I = V_T + \sqrt{\frac{K_0}{2K_3}(V_{DD} - V_{bp} - V_T)^2 - \frac{K_4}{K_3}(V_{bn} - V_T)^2} \quad (9)$$

The second order equation solution that includes the negative sign before the square root in Equation (9) has been rejected as it corresponds to a bias with an incorrect polarity. Note that the squared voltages may be interpreted as the gate voltage overdrive. The transition voltage may be increased by manipulating the transistor parameters. However, for some conventional differential amplifiers, e.g., the Moa/Molly amplifier, all parameters except $K_3$ are already given. Exemplary simulations show the differential input $V_i=0$ when the common mode input $V_I$ is slightly above 0.6 Volts. Thus, the width of positive output wave shaping transistor 230 may be the same as the width of the corresponding load transistor 218b, e.g., 12 microns. Similar calculations and simulations may be used to show that the width of positive output wave shaping transistor 220 may be the same as the width of the corresponding load transistor 218a.

Figure 7:
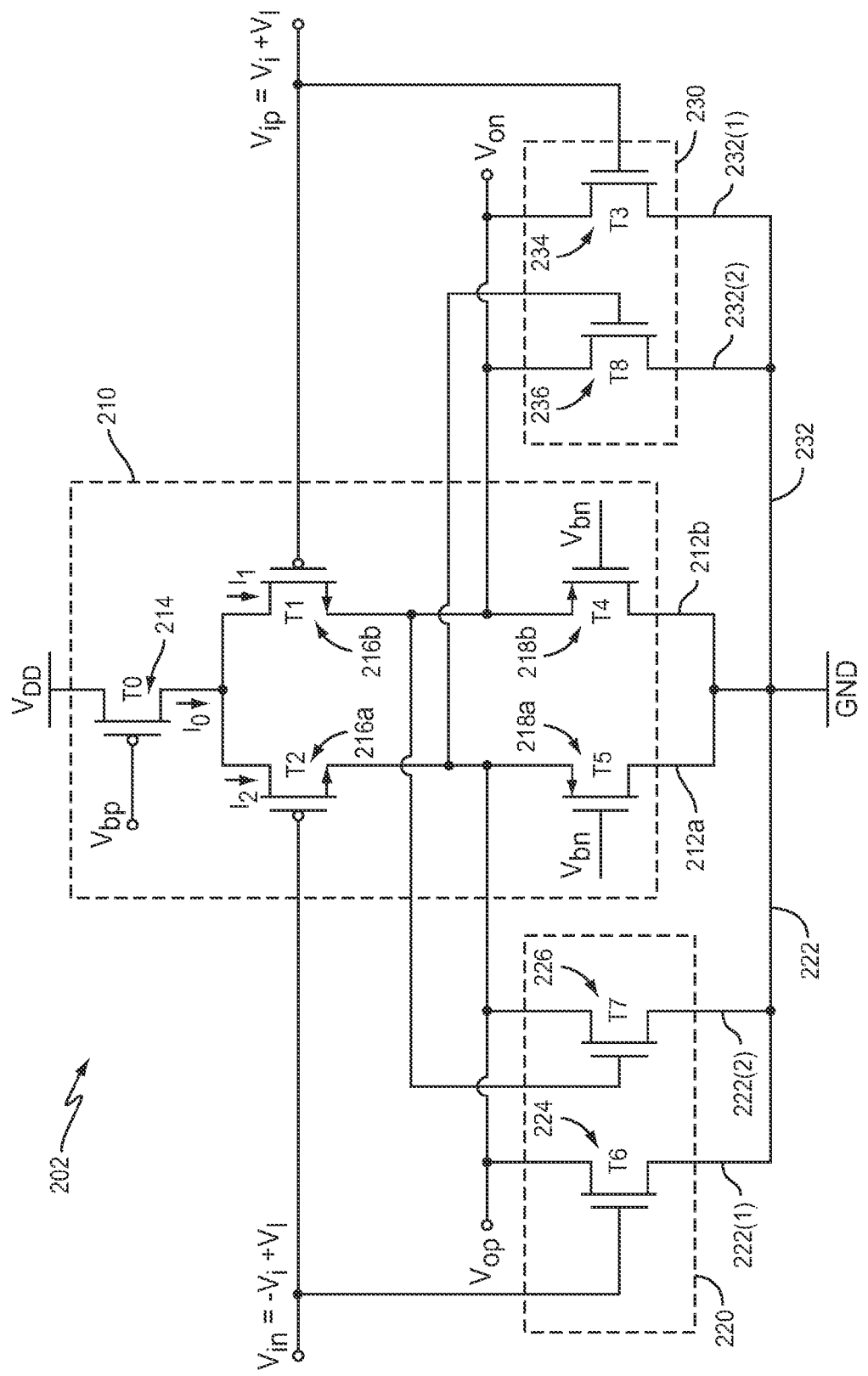
FIG. 7 shows a circuit diagram for a buffer according to another exemplary embodiment of the present invention.

While the above describes the present invention in terms of feed forward wave shaping transistors 224, 234, it will be appreciated that other configurations of wave shaping transistors 220, 230 may be used. For example, FIG. 7 depicts an alternative crystal oscillator buffer 202 according to another exemplary embodiment of the present invention that may include wave shaping transistors 220, 230 comprising feed forward transistors 224, 234 and feedback transistors 226, 236. The feed forward transistors 224, 234 each have a gate coupled to a differential input, a source coupled to a differential output, and a drain coupled to ground. The feedback transistors 226, 236, which may also be referred to as cross-coupled transistors, each have a gate and source coupled to different differential amplifier outputs, and a drain coupled to ground. While the conductance of feed forward transistors 224, 234 is directly controlled by the input sinusoidal wave, and the conductance of feedback transistors 226, 236 is directly controlled by the output square wave, it will be appreciated that the output square wave generally follows the same periodic response as the input sinusoidal wave. Thus, the conductance of the feedback transistors 226, 236 is indirectly controlled by the input sinusoidal wave.

The load transistors 218a, 218b, feed forward transistors 224, 234, and feedback transistors 226, 236 all conduct current whenever the buffer 202 is active, but the extent to which they conduct current at any given time depends on the voltage applied to the differential inputs. For example, during input sinusoidal peaks and valleys, the load shaping transistors 218a, 218b conduct more current while the feed forward transistors 224, 234 and feedback transistors 226, 236 conduct less current. As the input sinusoidal wave moves through the state transition periods between the peaks and valleys, the feed forward transistors 224, 234 and feedback transistors 226, 236 conduct more current while the load transistors 218a, 218b conduct less current. For example, feed forward transistors 224, 234 may shunt more current from the differential amplifier during a first portion of the state transition periods, while the feedback transistors 226, 236 may shunt more current during a second portion of the state transition periods.

Figure 8:
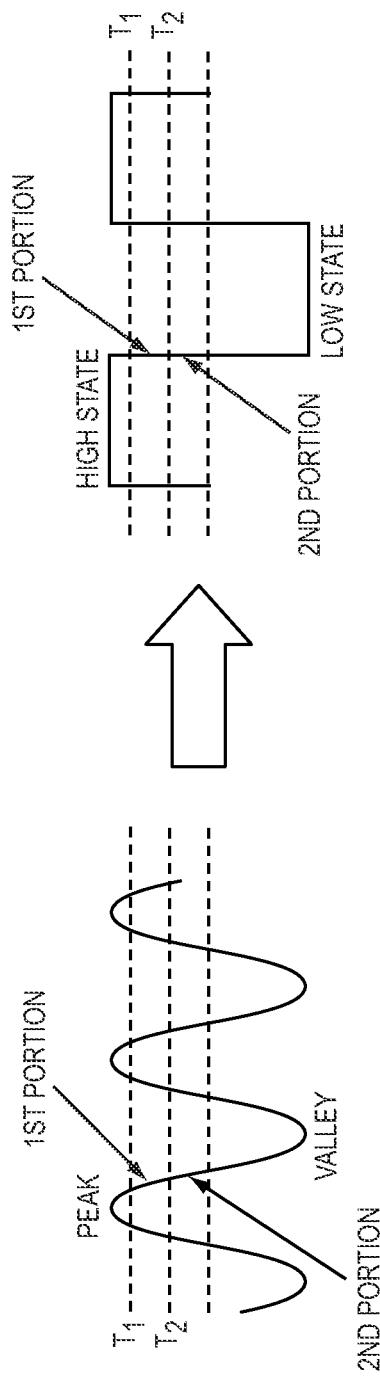
FIG. 8 shows exemplary transition areas for a sinusoidal wave and square wave.

The different portions of the state transition periods may be defined by predetermined thresholds. FIG. 8 shows one example of the different portions of a state transition period as defined by thresholds $T_1$ and $T_2$. The feed forward transistors 224, 234 and the feedback transistors 226, 236 may be configured to shunt current during the first and second portions, respectively. Alternatively, the feed forward transistors 224, 234 and the feedback transistors 226, 236 may be configured to shunt the current during the second and first portions, respectively. Furthermore, portions of the state transition period other than those shown in FIG. 11 may be used. While FIG. 8 shows an input sinusoidal wave and output square wave having the same amplitude, the present invention does not require this limitation. Should the amplitude of the output square wave differ from that of the input sinusoidal wave, the thresholds used to define the different portions of the state transition periods may be scaled accordingly to ensure the different portions of the square wave transition periods correspond to the same portions of the sinusoidal transition periods.

Figure 9:
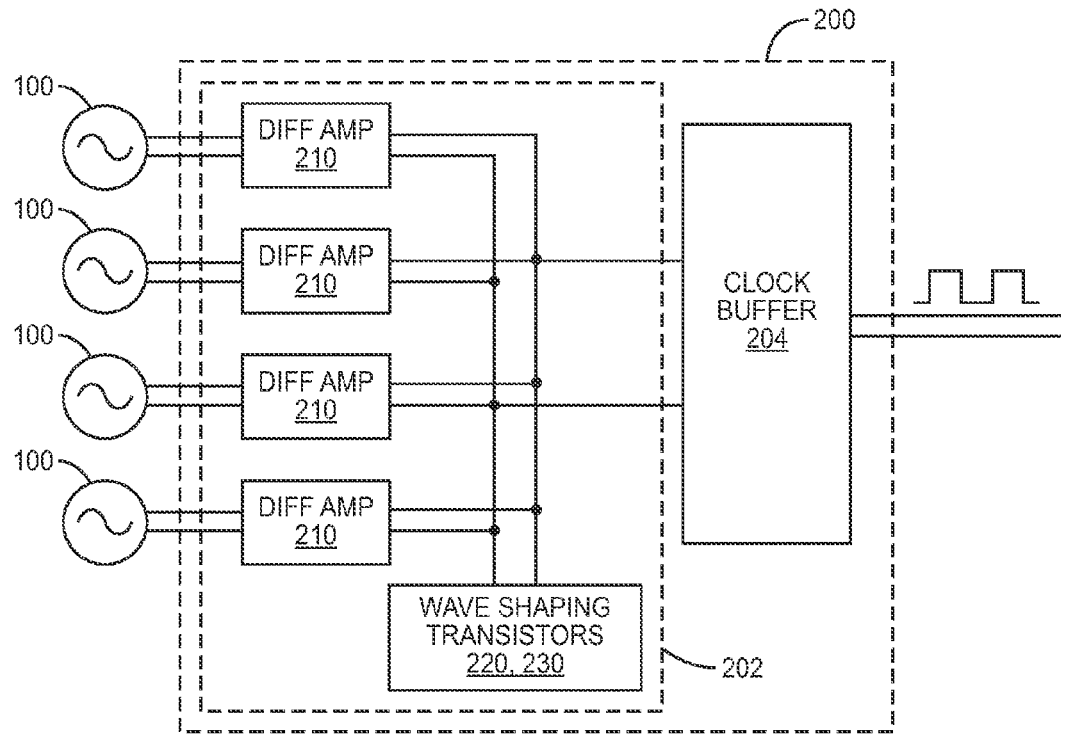
FIG. 9 shows a clock generator for multiple crystal oscillators according to another exemplary embodiment of the present invention.
Figure 10:
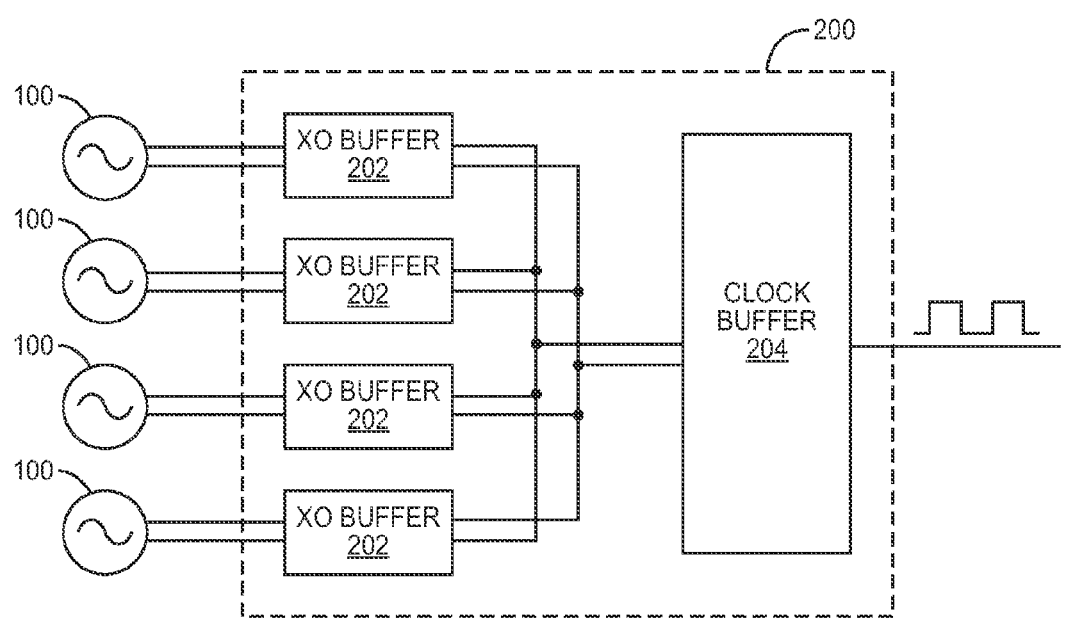
FIG. 10 shows a clock generator for multiple crystal oscillators according to another exemplary embodiment of the present invention.
Figure 11:
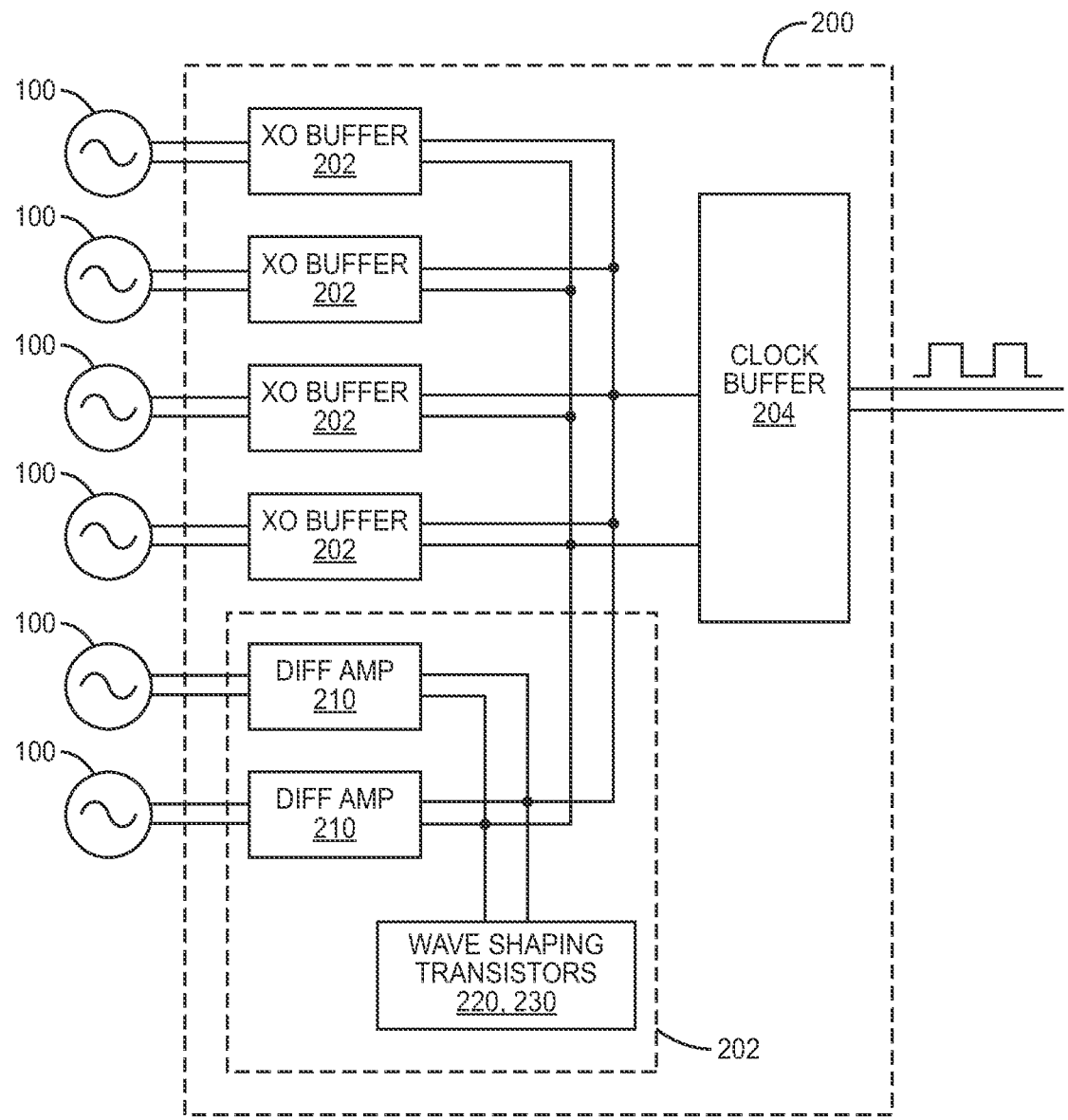
FIG. 11 shows a clock generator for multiple crystal oscillators according to one exemplary embodiment of the present invention.

The clock generator 200 shown in FIG. 2 generates a square wave from the sinusoidal wave output by a single crystal oscillator 100. In some devices, e.g., wireless communication devices, it is desirable to use multiple crystal oscillators that each operate at different frequencies to generate multiple digital square wave signals at different frequencies. The crystal oscillators 100 and buffers 202 are designed to be switched in parallel to change the drive conditions. FIG. 9 shows one exemplary crystal oscillator buffer 202 having multiple differential amplifiers 210, each coupled to a different crystal oscillator 100, and one set of wave shaping transistors 220, 230 coupled to all of the differential amplifiers 210. FIG. 10 shows an alternative embodiment, where individual crystal oscillators 100 are coupled to individual crystal oscillator buffers 202, where each buffer includes its own differential amplifier 210 and set of wave shaping transistors 220, 230. The present invention may apply to any number of crystal oscillator inputs. Further, the clock generator 200 may include a mixture of the buffer configurations shown in FIGS. 9 and 10, as shown in FIG. 11.

Figure 12:
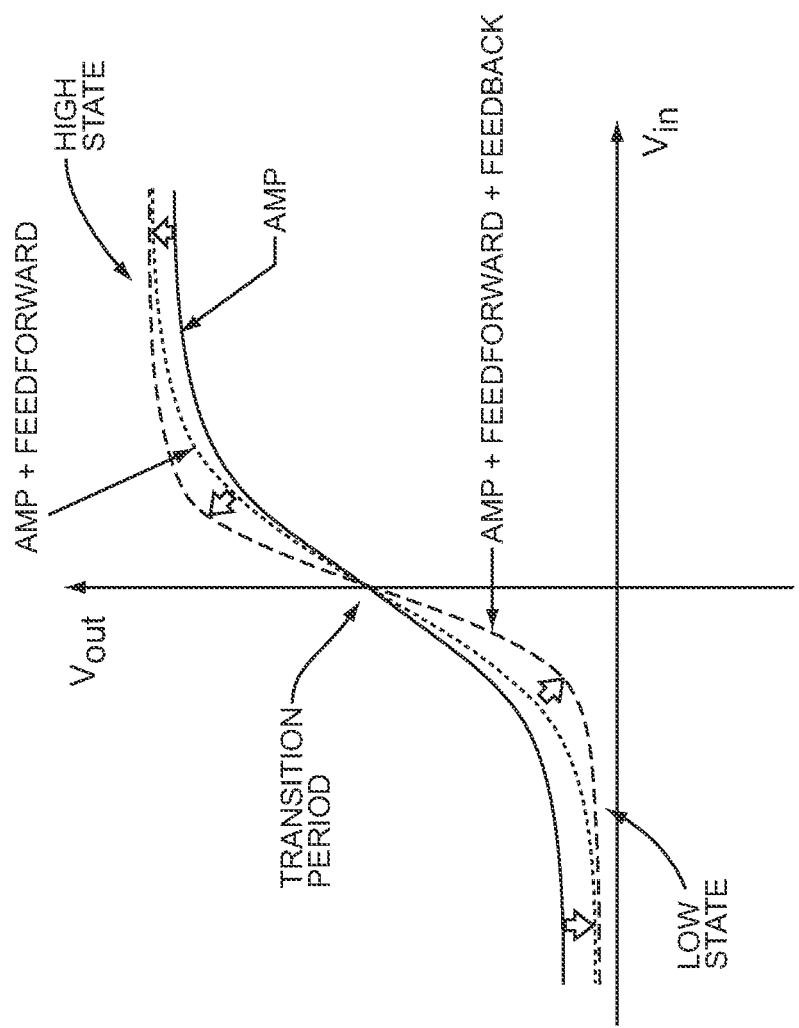
FIG. 12 compares the effects of the buffers of FIGS. 3 and 7 on the resulting square wave.

The above description discloses different exemplary buffers 202 that reduce phase noise in a square wave. FIG. 12 compares the square wave generated by a differential amplifier to the square waves generated when the wave shaping transistors 220, 230 comprise only the feed forward transistors 224, 234, and when the wave shaping transistors 220, 230 comprise both the feed forward transistors 224, 234 and the feedback transistors 226, 236. As shown in FIG. 12, the feed forward transistors 224, 234 increase the finite slope of the square wave transition period between the low state and the high state, and the combination of the feed forward and feed back transistors further increases the slope. As a result, the wave shaping transistors 220, 230 improves the overall phase noise performance of the buffer 202.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A buffer configured to generate a digital signal with reduced phase noise from an input sinusoidal wave provided by a crystal oscillator, said buffer comprising:
   a current source comprising a transistor operatively connected to a power supply;
   a differential amplifier having differential inputs, a pair of serially connected transistors, and differential outputs interposed between the pair of serially connected transistors, each of said serially connected transistor pairs comprising an inverting transistor coupled to the current source transistor and a load transistor serially connected between the inverting transistor and ground, wherein the differential inputs couple to the inverting transistors, and wherein a gate of each load transistor is coupled to a non-zero fixed bias voltage, said differential amplifier configured to convert the input sinusoidal wave applied to the differential inputs to an output square wave comprising alternating high and low states connected by square wave state transition periods having a finite slope;
   a first feed forward transistor connected to the differential amplifier between a positive differential output and the ground; and
   a second feed forward transistor connected to the differential amplifier between a negative differential output and the ground;
   wherein the first and second feed forward transistors comprise a different transistor type than the inverting transistors; and
   wherein the first and second feed forward transistors are configured to shape the output square wave by increasing the finite slope of the output square wave during sinusoidal state transition periods between peaks and valleys of the input sinusoidal wave.

2. The buffer of claim 1 wherein a drain, a gate, and a source of the first feed forward transistor are respectively connected to the positive differential output, a negative differential input, and the ground, and wherein a drain, a gate, and a source of the second feed forward transistor are respectively connected to the negative differential output, a positive differential input, and the ground.

3. The buffer of claim 1 wherein:
   the load transistors are coupled between the differential outputs and the ground, and the load transistors provide primary current drain paths between the differential outputs and the ground during the peaks and valleys of the input sinusoidal wave; and
   the first and second feed forward transistors are configured to respectively provide a first current shunting path between the positive differential output and the ground and a second current shunting path between the negative differential output and the ground such that the first and second current shunting paths dominate the primary current drain paths during the sinusoidal state transition periods of the input sinusoidal wave.

4. The buffer of claim 3 wherein the differential amplifier is configured such that the primary current drain paths dominate the first and second current shunting paths during the peaks and valleys of the input sinusoidal wave.

5. The buffer of claim 3 further comprising a first feedback transistor connected to the differential amplifier in parallel with the first feed forward transistors between the positive differential output and the ground and a second feedback transistor connected to the differential amplifier in parallel with the second feed forward transistors between the negative differential output and the ground, wherein the first and second feedback transistors respectively provide third and fourth current shunting paths between the positive and negative differential outputs and the ground.

6. The buffer of claim 5 wherein a drain, a gate, and a source of the first feedback transistor are respectively connected to the positive differential output, the negative differential output, and the ground, and wherein a drain, a gate, and a source of the second feedback transistor are respectively connected to the negative differential output, the positive differential output, and the ground.

7. The buffer of claim 5 wherein:
   the differential amplifier is configured such that the primary current drain paths dominate the first, second, third, and fourth current shunting paths when the input sinusoidal wave exceeds a first threshold;
   the first and second feed forward transistors are configured such that the first and second current shunting paths dominate the third and fourth current shunting path and the primary current drain paths when the sinusoidal state transition periods of the input sinusoidal wave at the differential inputs exceed a second threshold and are less than or equal to the first threshold; and
   the first and second feedback transistors are configured such that the third and fourth current shunting paths dominate the first and second current shunting paths and the primary current drain paths when the square wave state transition periods of the output square wave at the differential outputs are less than or equal to the second threshold.

8. The buffer of claim 5 wherein:
   the differential amplifier is configured such that the primary current drain paths dominate the first, second, third, and fourth current shunting paths when the input sinusoidal wave exceeds a first threshold;
   the first and second feedback transistors are configured such that the third and fourth current shunting paths dominate the first and second current shunting path and the primary current drain paths when the square wave state transition periods of the output square wave at the differential outputs exceed a second threshold and are less than or equal to the first threshold; and
   the first and second feed forward transistors are configured such that the first and second current shunting paths dominate the third and fourth current shunting paths and the primary current drain paths when the sinusoidal state transition periods of the input sinusoidal wave at the differential inputs are less than or equal to the second threshold.

9. The buffer of claim 1 wherein if the crystal oscillator comprises more than one crystal oscillator unit and the differential amplifier comprises more than one differential amplifier unit, each differential amplifier unit is coupled to a different one of the crystal oscillator units, and wherein the first and second feed forward transistors are connected to the differential outputs of each of the differential amplifier units.

10. The buffer of claim 1 wherein the crystal oscillator comprises one or more crystal oscillator units, wherein:
   if the crystal oscillator comprises more than one crystal oscillator unit and the differential amplifier comprises more than one differential amplifier unit, each differential amplifier unit is coupled to a different one of the crystal oscillator units,
   the first feed forward transistor comprises one or more first feed forward transistor units, each coupled between a positive differential output and the ground of a different one of the differential amplifier units; and the second feed forward transistor comprises one or more second feed forward transistor units, each coupled between a negative differential output and the ground of a different one of the differential amplifier units.

11. A method of converting an input sinusoidal wave provided by a crystal oscillator to a digital signal with reduced phase noise, the method comprising:
applying the input sinusoidal wave to differential inputs of a differential amplifier comprising a pair of serially connected transistors each of said serially connected transistor pairs comprising an inverting transistor coupled to a current source transistor and a load transistor serially connected between the inverting transistor and ground, wherein the differential inputs couple to the inverting transistors, and wherein a gate of each load transistor is coupled to a non-zero fixed bias voltage;
outputting a square wave at differential outputs interposed between the inverting and load transistors of the serially connected transistors, said output square wave comprising alternating high and low states connected by square wave state transition periods having a finite slope; and
wave shaping the output square wave to increase the finite slope of the square wave transition periods by shunting current from the positive and negative differential outputs to the ground via feed forward transistors during sinusoidal state transition periods between alternating peaks and valleys of the input sinusoidal wave, wherein each feed forward transistor has a gate connected to one of the differential inputs, a drain connected to one of the differential outputs, and a source connected to the ground, and wherein the feed forward transistors comprise a different transistor type than the inverting transistors.

12. The method of claim 11 wherein the wave shaping further comprises shunting the current to the ground during the sinusoidal state transition periods via a pair of feedback transistors connected between the differential outputs and the ground, each feedback transistor having a gate connected to one of the differential outputs, a drain connected to the other of the differential outputs, and a source connected to the ground.

13. The method of claim 12 wherein shunting current to the ground during the sinusoidal state transition periods comprises:
shunting the current to the ground via the pair of feed forward transistors when the sinusoidal state transition periods of the input sinusoidal wave at the differential inputs exceed a second threshold and are less than or equal to a first threshold; and
shunting the current to the ground via the pair of feedback transistors when the square wave state transition periods of the output square wave at the differential outputs are less than or equal to the second threshold.

14. The method of claim 12 wherein shunting current to the ground during the sinusoidal state transition periods comprises:
shunting the current to the ground via the pair of feedback transistors when the square wave state transition periods of the output square wave at the differential outputs exceed a second threshold and are less than or equal to a first threshold; and
shunting the current to the ground via the pair of feed forward transistors when the sinusoidal state transition periods of the input sinusoidal wave at the differential inputs are less than or equal to the second threshold.

15. The method of claim 11 wherein the crystal oscillator comprises one or more crystal oscillator units and the differential amplifier comprises one or more differential amplifier units, wherein if the crystal oscillator comprises more than one crystal oscillator unit and the differential amplifier comprises more than one differential amplifier unit, applying the input sinusoidal wave comprises applying the input sinusoidal wave from different crystal oscillator units to the differential inputs of different ones of the differential amplifier units, and wherein shunting the current from the differential outputs to the ground comprises shunting the current from each of the differential outputs to the ground via a pair of feed forward transistors having a gate connected to each of the differential inputs, a drain connected to each of the differential outputs, and a source connected to the ground.

16. The method of claim 11 wherein the crystal oscillator comprises one or more crystal oscillator units, wherein if the crystal oscillator comprises more than one crystal oscillator unit and the differential amplifier comprises more than one differential amplifier unit, applying the input sinusoidal wave comprises applying the input sinusoidal wave from different crystal oscillator units to the differential inputs of different ones of the differential amplifier units, and wherein shunting the current from the differential outputs to the ground comprises shunting the current from each of the differential outputs to the ground via a different pair of feed forward transistors, each of said pairs of feed forward transistors having a gate, drain, and source respectively connected to the differential inputs, differential outputs, and the ground of one of the differential amplifiers.

17. A method of reducing phase noise in an output square wave comprising alternating high and low states derived from an input sinusoidal wave comprising alternating peaks and valleys, the method comprising:
applying the input sinusoidal wave to differential inputs of a differential amplifier to generate the output square wave at differential outputs of the differential amplifier, the alternating high and low states of the output square wave connected by square wave transition periods having a finite slope, wherein the differential amplifier comprises a pair of serially connected transistors, each of said serially connected transistor pairs comprising an inverting transistor coupled to a current source transistor and a load transistor serially connected between the inverting transistor and ground, wherein the differential outputs are interposed between the inverting and load transistors, wherein the differential inputs couple to the inverting transistors, and wherein a gate of each load transistor is coupled to a non-zero fixed bias voltage;
maintaining properties of the high and low states by configuring the load transistors of the differential amplifier to provide primary paths between the output and the ground during the peaks and valleys of the input sinusoidal wave; and
increasing the finite slope of the square wave transition periods by connecting feed forward transistors between the differential outputs and the ground, said feed forward transistors conducting more current than the primary paths of the differential amplifier during sinusoidal state transition periods connecting the peaks and valleys of the input sinusoidal wave, and said feed forward transistors comprising a different transistor type than the inverting transistors.

18. The method of claim 17 wherein increasing the finite slope further comprises connecting feedback transistors in parallel with the feed forward transistors between the differential outputs and the ground that conduct more current than the primary paths during the sinusoidal state transition periods.

19. The method of claim 18 wherein the feed forward transistors conduct more current than the primary paths during a first portion of the sinusoidal state transition periods and the feedback transistors conduct more current than the primary paths during a second portion of the sinusoidal state transition periods.

* * * * *